(12) United States Patent
Fournel et al.

(10) Patent No.: US 7,579,259 B2
(45) Date of Patent: Aug. 25, 2009

(54) SIMPLIFIED METHOD OF PRODUCING AN EPITAXIALLY GROWN STRUCTURE

(75) Inventors: Frank Fournel, Villard Bonnot (FR); Hubert Moriceau, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/158,191

(22) PCT Filed: Dec. 4, 2006

(86) PCT No.: PCT/EP2006/069263

§ 371 (c)(1),
(2), (4) Date: Jun. 19, 2008

(87) PCT Pub. No.: WO2007/074027

PCT Pub. Date: Jul. 5, 2007

(65) Prior Publication Data

US 2008/0272396 A1 Nov. 6, 2008

(30) Foreign Application Priority Data

Dec. 27, 2005 (FR) .................................. 05 54107

(51) Int. Cl.
*H01L 21/30* (2006.01)
*H01L 21/46* (2006.01)

(52) U.S. Cl. .................. 438/455; 438/458; 438/459; 257/190; 257/E21.09

(58) Field of Classification Search .............. 438/455, 438/458, 459, 460, 479; 257/90, E21.09, 257/E29.002, 190

See application file for complete search history.

(56) References Cited

U.S. PATENT DOCUMENTS 5,285,086 A * 2/1994 Fitzgerald, Jr. ............... 257/85

(Continued)

FOREIGN PATENT DOCUMENTS

| FR | 2 766 620 A1 | 1/1999 |
| FR | 2 815 121 A1 | 4/2002 |
| FR | 2 819 099 A1 | 7/2002 |

OTHER PUBLICATIONS

J.W. Matthews, et al.,"Defects in Epitaxial Multilayers", Journal of Crystal Growth, No. 27, 1974, pp. 118-125.

(Continued)

*Primary Examiner*—Phuc T Dang
(74) *Attorney, Agent, or Firm*—Oblon, Spivak, McClelland, Maier & Neustadt, P.C.

(57) ABSTRACT

Method to produce a structure consisting of depositing a material by columnar epitaxy on a crystalline face of a substrate (2), of continuing so that the columns (4) give a continuous layer (5). The surface is provided with a period array of bumps (3) on a nanometric scale, each bump (3) having a support zone (35) and being obtained from an array of crystalline defects and/or strain fields created within a crystalline region (16) located in the vicinity of a bonding interface (15) between two crystalline elements (11, 12) whose crystalline lattices have a twist and/or tilt angle and/or have interfacial lattice mismatch, able to condition the period (38) of the array of bumps (3). The period (38) of the array, the height (36) of the bumps and the size of their support zone (35) being adjusted so that the continuous layer (40) has a critical thickness that is greater than that obtained using epitaxy without the bumps.

21 Claims, 9 Drawing Sheets

U.S. PATENT DOCUMENTS

| | | | |
|---|---|---|---|
| 5,550,070 A * | 8/1996 | Funai et al. | 438/486 |
| 6,261,928 B1 | 7/2001 | Bruel | |
| 7,041,227 B2 | 5/2006 | Fournel et al. | |
| 7,186,630 B2 * | 3/2007 | Todd | 438/478 |
| 2002/0111044 A1 | 8/2002 | Linthicum et al. | |
| 2005/0101095 A1 | 5/2005 | Fournel et al. | |

OTHER PUBLICATIONS

D. Zubia, et al., "Nanoheteroepithaxy : Nanofabrication Route to Improved Epitaxial Growth", Journal of Vac. Sci. Technol. B18(6), Nov./Dec. 2000, pp. 3514-3520.

* cited by examiner

SIMPLIFIED METHOD OF PRODUCING AN EPITAXIALLY GROWN STRUCTURE

CROSS REFERENCE TO RELATED APPLICATION

This application is a 371 of PCT/EP06/069263, filed on Dec. 4, 2006, and claims priority of French Patent Application No. 0554107, filed on Dec. 27, 2005.

TECHNICAL AREA

The present invention relates to a method to produce an epitaxied structure. It is recalled that epitaxy is a technique to grow crystals which, on the surface of a host crystalline substrate, is used to form layers whose crystalline axes relate with the crystalline axes of the host substrate. The term heteroepitaxy is used if the deposited material is of different chemical species to the material of the host substrate. Substrates coated in this manner are of great advantage for the manufacture of semiconductor, optic or optoelectronic devices. Optimization of the crystalline growth of the layers can bring an improvement in the performance of these devices.

STATE OF THE PRIOR ART

Deposit by heteroepitaxy on a substrate generates misfit dislocations on and after a certain thickness of the deposited layer, called a critical thickness. This thickness depends on the difference in lattice parameters between the epitaxied material and the material of the host substrate. Reference can be made for example to the article by C J. W. Matthews and A. E. Blakeslee, <<Defects in epitaxial multilayers>> Journal of Crystal Growth n°27, pages 118-125, 1974. Lattice parameters are the lateral dimensions of the elementary cell describing the crystalline material.

There are numerous methods to attenuate this drawback. Among such methods, one consists of using previous epitaxy to grow columns (sometimes called islands in the literature) spaced apart from one another on the host substrate. The advantage is that the epitaxied material, when growing in column form, is able to relax its strain on the free surface of the host substrate. For example, for compressive growth of a column on a substrate, the column will gradually flare outwardly, its diameter increasing to relax the strain within the deposited material. Conversely, with extension growth of a column, the column will gradually shrink, its diameter tending to decrease in order to relax its strain. Simultaneously with strain relaxation, lateral growth occurs which tends to increase permanently the diameter of the columns. Therefore, by continuing to flare outwardly the columns end up by joining together to form a continuous layer. Depositing conditions can be modified to promote lateral growth and coalescence i.e. bonding of the contacting columns. If the spacing between columns is suitable, by the time the columns meet up, the epitaxied material will have relaxed all or part of its strain, and will thereby have recovered all or part of its natural lattice parameter. The extent of relaxation can be quantified by the rate of relaxation corresponding to the ratio between the initial strain level and that obtained after epitaxy with no defect occurrence. By continuing epitaxial deposit, a layer of material is obtained which has little or even no dislocations since all or part of lattice mismatch strains have been overcome. The critical thickness that can be obtained for this layer is greater than would have been obtained by standard or conventional epitaxy over the entire surface of the host substrate.

One technique used to obtain columns consists of delimiting localized growth seeds on the surface of the host substrate, these growth seeds having a suitable surface which corresponds to the surface of the base of the columns. For this purpose, a growth mask can be deposited on the surface of the host substrate, this mask being provided with openings exposing the host substrate. The exposed substrate at the bottom of these openings forms the growth seeds. As a variant, it is possible, as described in the article <<Nanoheteroepitaxy: nanofabrication route to improved epitaxial growth >> D. Zubia et al, Journal of Vac. Sci. Technol. B 18(6), November/December 2000, pages 3514-3520, to use a thin crystalline layer joined to a substrate having a material on its surface on which epitaxial growth is not possible. In the article, the material is silica. The thin layer is etched by lithography and reactive ion etching (RIE) so as to expose the substrate locally and thereby delimit patches in the thin layer which form growth seeds. Epitaxy can then be started to grow the material to be epitaxied from the seeds. Since the material to be epitaxied is only deposited at the growth seeds, growth occurs in the form of columns or islands.

The problems generated by this method are that it requires a lithography step to etch the mask or the crystalline layer, and thereby define growth seeds. These growth seeds however must be formed on a nanometric scale, their size typically lying between one and a few dozen nanometers, and they must be distributed most regularly on the surface of the host substrate, the distance between these seeds being in the order of a dozen to a few hundred nanometers. At the present time no satisfactory method is known to produce said growth seeds in collective, orderly fashion on the scale of a substrate whose diameter may reach 300 millimeters and over.

DESCRIPTION OF THE INVENTION

The present invention sets out to propose a method to produce an epitaxied structure by growing columns on a nanometric scale, without having to resort to a nanometric scale lithography step. This substrate is obtained economically and may have a large surface area. The position and geometry of the columns are obtained with great accuracy.

More precisely, the present invention is a method to produce an epitaxied structure, consisting of depositing a material by columnar epitaxial growth on a crystalline face of a substrate, of continuing deposit until the columns joint together and lead to a continuous layer. It consists of providing the face of the substrate with a periodic array of bumps on a nanometric scale, each bump having a support zone for a column, and being obtained directly or indirectly from an array of crystalline defects and/or strain fields created within a crystalline area located in the vicinity of a bonding interface between two elements comprising crystalline material and having crystalline lattices with a twist angle and/or tilt angle and/or having interfacial lattice mismatch, able to condition the period of the bump array, the period of the array, the height of the bumps and the size of their support zone being adjusted so that the continuous layer has a critical thickness that is greater than that obtained with epitaxy conducted without bumps.

It is preferable for the period of the array, the height of the bumps and the size of their support zones to be adjusted so that the material deposited by epitaxy has recovered its natural lattice parameter at the time the columns meet up.

The substrate whose face is provided with an array of bumps can be made from the two bonded elements, by thinning one of the elements until a surface relief is exposed corresponding to an array of crystalline defects and/or strain fields, this relief then forming the array of bumps, this bump array being carried by the other element.

Thinning may comprise at least one step chosen from among mechanical abrasion, chemical abrasion, grinding, sacrificial treatment.

The method may also comprise a step to treat the bump array so as to adjust the height and/or size of the bump support zone and/or to modify the lattice parameter of the constituent material of the bumps.

The treatment step of the bump array may also comprise an implanting step.

The thinning and/or treatment step of the bump array may comprise at least one chemical attack and/or electrochemical attack and/or mechanical attack and/or ionic attack and/or photochemical attack and/or depositing step.

The thinning step and/or treatment step of the bump array may include a heat schedule in different atmospheres whether oxidizing or reducing.

To form the elements, at least two parts can be taken from one same crystalline structure, these two parts contributing towards the formation of the bonding interface.

At the time of bonding, the crystalline lattice of the two parts preferably are offset from a predetermined twist angle and/or tilt angle.

The crystalline structure preferably comprises locating marks which are transferred to the two parts at the time they are taken, these locating marks being used to adjust the twist and/or tilt angle.

At least one of the elements is a composite substrate formed of a stack comprising a carrier, a stop layer for thinning of the carrier and at least one crystalline layer.

The thinning step preferably concerns the composite substrate.

The composite substrate may be a SOI substrate.

The part taken from the composite substrate comprises at least one crystalline layer.

Bonding may be molecular bonding.

It is possible to cause the composition of the deposited material to vary during epitaxial deposit.

As a variant, the substrate whose face is provided with the bump array can be produced by duplicating a mother substrate of which one face comprises a bump array on a nanometric scale, the mother substrate being obtained from the two bonded elements and by at least one thinning step of one of the elements, leading directly or indirectly to exposure of the array of crystalline defects and/or strain fields, this array of crystalline defects and/or strain fields forming the bump array.

Duplication can be made by nanoimprint using a mould matching the mother substrate.

The mould can be obtained by nanoimprint from the mother substrate.

The present invention also concerns an epitaxied structure comprising columns of epitaxied material flaring outwardly so that they join together and form a continuous layer. Each column rests on a support zone for a bump of a periodic bump array on a nanometric scale provided on one face of a substrate, these bumps being derived directly or indirectly from an array of crystalline defects and/or strain fields, the bumps of the array having their period, height and support zone size adjusted so that the continuous layer has a critical thickness that is greater than that obtained with epitaxy conducted without the presence of nabumps.

BRIEF DESCRIPTION OF THE DRAWINGS

The present invention will be better understood on reading the description of examples of embodiment, given solely for indication purposes and in no way limiting, with reference to the appended drawings in which.

Identical, similar or equivalent parts in the different figures carry the same reference numbers to facilitate cross-referencing between the figures.

Figure 1A:
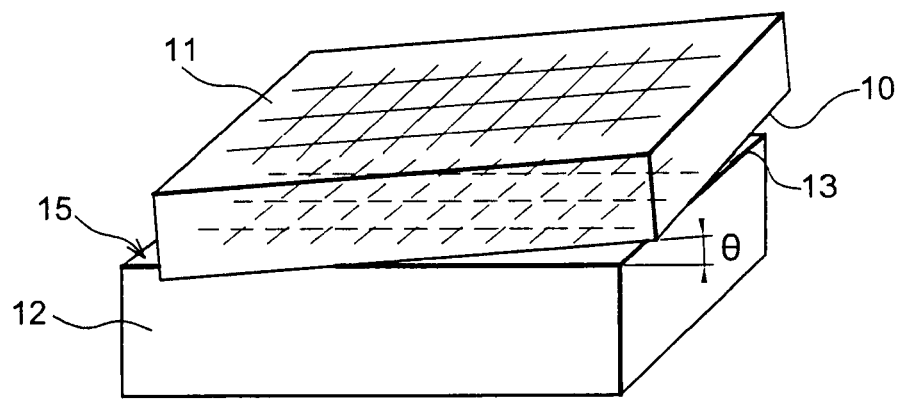
FIGS. 1A to 1G show the steps to produce an epitaxied structure following a first example of the method of the invention.

The different parts shown in the figures are not necessarily drawn to uniform scale, for better legibility of the figures

DETAILED DESCRIPTION OF PARTICULAR EMBODIMENTS

Reference is made to FIGS. 1A to 1G which show the different steps of a first example of the method to produce an epitaxied structure according to the invention. The method subject of the invention consists of producing the epitaxied structure by starting the deposit of the material to be epitaxied by column growth on a free crystalline surface 1 of a substrate 2 provided with a bump array 3 on a nanometric scale as illustrated FIG. 1D. The size of these bumps is in the order of 1 to a few dozen nanometers, typically 20 nanometers. This substrate 2 can be called a nanostructured substrate. As illustrated FIG. 1E, the columns 4 bear upon these bumps 3 and more precisely on an end zone 35 of the bumps, also called a support zone in the remainder hereof. These support zones 35 form the base of the columns 4. This depositing continues as in the prior art until the columns 4 meet up and form a uniform continuous layer 5. The size of the bumps and the period of the bump array are adapted so that the deposited material has a desired strain relaxation rate e.g. the greatest possible, at the time of coalescence, i.e. at the time the columns 4 join together. By size is meant their height 36 and the size of the support zone 35. The uniform continuous layer 5 which is formed when epitaxy deposit is continued, will therefore also have strains that are relaxed in full or in part. It will have a critical thickness 39 that is greater than that obtained by conventional epitaxy with no prior column growth.

It will now be seen how the bumps 3 are obtained on a nanometric scale. They may, for example, be substantially parallelepiped volumes with a size in the order of one or a few dozen nanometers.

Several simple ways of obtaining this bump array 3 on a nanometric scale are explained in patent application FR-A-2 766 620. It is possible, for example, to start by molecular bonding one face 10 in crystalline material of a first element 11 against one face 13 in crystalline material of a second element 12 by causing the two faces 10, 13 to have crystalline lattices offset by a determined angle $\theta$ and a resulting tilt angle between the vertical axes of the crystalline lattices that is zero. Through molecular bonding, covalent bonds are formed between the two crystalline lattices of the faces to be assembled.

Angle θ is known as the twist angle, which is the term which will be used in the remainder hereof.

With respect to bonding between two silicon wafers having a crystalline direction <001> for example, the introduction of a given twist angle θ produces a square array of dislocations. The introduction of a tilt angle would produce a one-dimensional array of dislocations.

Figure 1B:
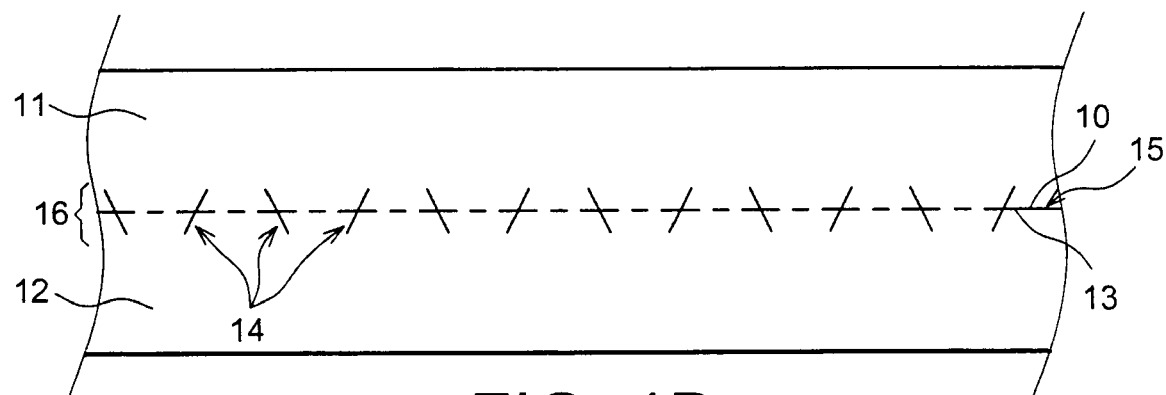

FIG. 1A shows the contacting of the two elements 11, 12 and illustrates the twist angle θ and the crystalline lattices of the two elements 11, 12. This bonding using molecular bonding is conducted so that interatomic bonds are set up between the two elements 11, 12 and, owing to their angle offset, cause the formation of a periodic array of crystalline defects and/or strain fields 14 with a crystalline region 16 located in the vicinity of the bonding interface 15. FIG. 1B is a cross-section showing the structure obtained after bonding and illustrates the array of crystalline defects and/or strain fields obtained. As a variant or supplement, it is also possible to modulate the tilt angle and/or the lattice mismatch between the two arrays to obtain other arrays of crystalline defects and/or strain fields. It is assumed in the example of FIGS. 1 and 2 that the tilt angle and lattice mismatch have been minimized so that the created array is essentially dependent on the twist angle.

Bonding can be hot or cold bonding. It is preferably reinforced by heat treatment to obtain this array of crystalline defects and/or strain fields 14. These crystalline defects may be dislocations. The crystalline region 16 is of narrow thickness (a few dozen nanometers) and is located around the interface 15. This array 14 of crystalline defects and/or strain fields is the source of the array of bumps on a nanometric scale.

The period of the array of crystalline defects and/or strain fields depends on the twist angle θ of the crystalline lattices of the two elements 11, 12. Reference can be made to FIG. 1A.

Figure 1C:
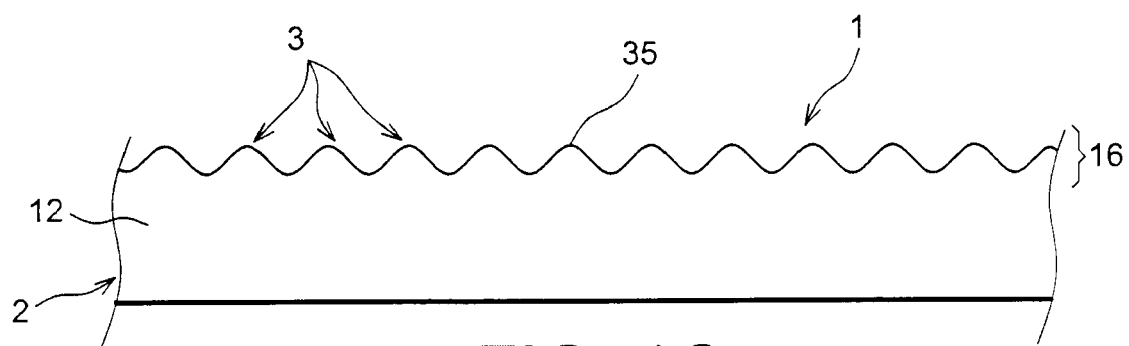

Subsequently, one of the two assembled elements 11, 12 is thinned e.g. by grinding, mechanical or chemical abrasion, so that the presence of the array 14 of crystalline defects and/or strain fields induces a relief pattern of bumps and recesses on the freed surface. The recesses may correspond to crystalline defects and the bumps to the crystalline material of the crystalline region 16 or reciprocally. It is on these bumps 3 and more particularly on the end or support zone 35 that the columns are to be grown. Reference can be made to FIG. 1C which shows the induced array of bumps. The structured surface obtained may be located in the first element 11, it may overlap the two elements 11, 12 as illustrated FIG. 1C, or it may lie in the second element 12 if element 11 has been fully removed.

Figure 1D:
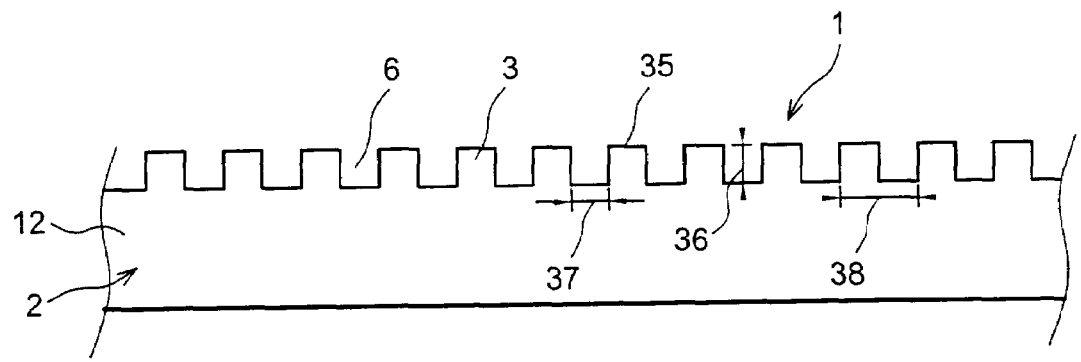
Figure 1E:
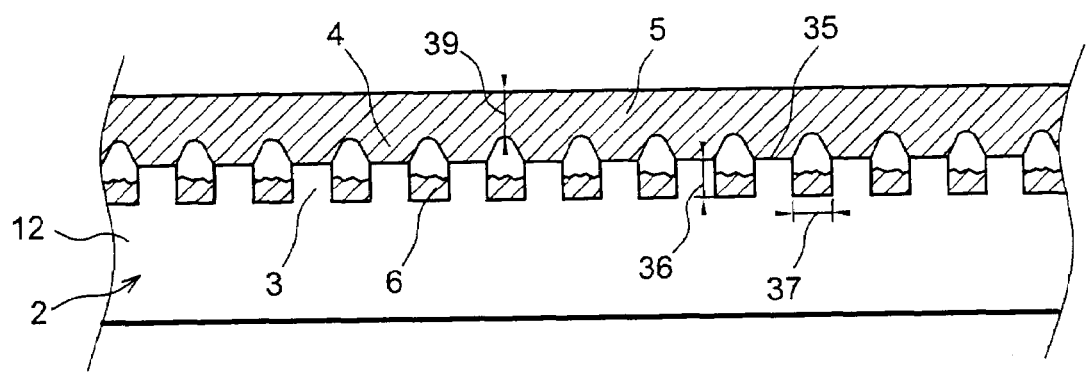

An optional surface treatment can then be conducted to further enhance the surface relief as illustrated FIG. 1D, and to adjust the height 36 of the bumps 3 and size of their support zone 35. For example, a chemical bath can be used to attack the crystalline defects 14 selectively, without attacking their vicinity. This gives a nanostructured substrate i.e. having an array of bumps 3 separated by recesses 6, these recesses and these bumps being sized on a nanometric scale. The twist angle between the two elements 11, 12 conditions the period of the array of crystalline defects and/or strain fields as seen previously, and hence also the period 38 between the bumps 3. With silicon as crystalline material, it is possible to modulate and control this period 38 in highly fine-tuned manner, ranging for example from a few nanometers to a few hundred nanometers with an accuracy in the order of a few tenths of a nanometer if the adjustment of the twist angle is made to an accuracy in the order of one hundredth of a degree. This accuracy can be obtained as taught in patent application FR-A1-2 819 099 by taking the two elements 11, 12 from one same initial structure and by previously providing this structure with one or locating marks before separating the two elements. Then all that is required is to control accurately the relative angle positions of the two elements before assembling them together using the locating marks. This method is described further on with reference to FIG. 2. Evidently there are other methods, but previous knowledge must be had of the crystalline directions of the crystalline lattices present on faces 10, 13 to be assembled of elements 11, 12. These methods do not always lead to such good precision, and above all they generally do not allow minimization of the tilt angle, which causes the onset of an additional one-dimensional array of dislocations which has to be managed and which interacts with the array of crystalline defects and/or strain fields generated by the twist angle.

This period 38 is one of the elements which can be used to control the time at which the columns join together, in relation to the thickness of epitaxied material. It is dependent on the twist angle.

The operation to expose the array of bumps 3 and optionally the treatment operation to enhance the relief of the bumps 3 enable the height 36 and/or size of the support zone 35 of the bumps 3 to be varied. Since the period 38 of the array is fixed by the twist angle, the spacing 37 between the bumps changes at the same time as the size of the support zone 35.

Figure 1F:
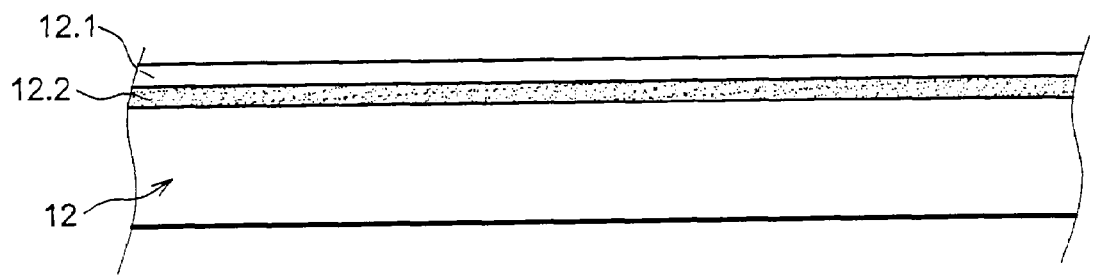

As a variant, the element which is not thinned, in the example element 12, could be formed of a stack with a film 12.1 in crystalline material covering an etch stop layer 12.2 as illustrated FIG. 1F. The assembly of this element with the other could be carried out as described previously. The stop layer 12.2 could, for example, be made in silicon oxide, silicon nitride, amorphous silicon. The film 12.1 may chosen from one of the materials cited later as host crystalline material, e.g. silicon.

The advantage of using an element 12 such as illustrated 1F is that, during treatment, the stop layer 12.2. will be exposed locally at the recesses 6, and on this account two separate materials will be obtained on the surface of which advantageously only one will allow epitaxial growth. A second advantage is the ability to control independently the height and lateral dimensions of the bumps.

Figure 1G:
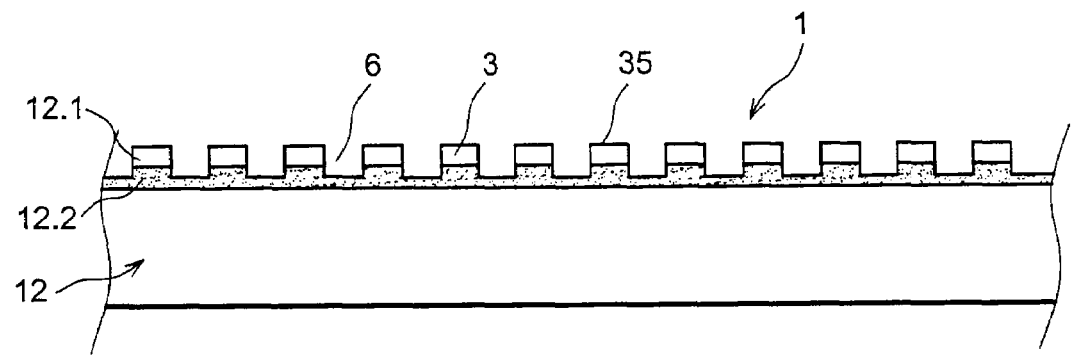

The stop layer 12.2 can be attacked only in part or not at all. Attack may be dry or wet attack, chemical, ionic, electrochemical, photochemical, thermal, in a reducing or oxidizing atmosphere. For example, attack may be very low speed in the stop layer 12.2 relative to the attack in the crystalline material to adjust the side dimensions of the bumps 7. Reference can be made to FIG. 1G.

To increase the height of the bumps, the stop layer may be etched selectively with respect to the material of the film 12.1 and the underlying layer.

Epitaxial growth occurs in columns on the support zone 35 of the bumps 3, but evidently also in the recesses. By adjusting the size of the bumps, it is sought not to allow the recesses to be fully filled with material. With bumps 3 that are sufficiently high and close, for example with a height 36 in the order of 10 nanometers and a spacing 37 in the order of 3 nanometers, column growth is sufficiently delinked from growth in the recesses 6 to allow relaxing of the material forming the columns 4 and the formation of the uniform continuous layer whose strains are relaxed.

By acting on the three parameters which are the height 36 of the bumps, the size of their support zone 35 and their period

38, it is possible to cause materials of different lattice parameter to grow on substrates 2 of a given material provided with a suitable bump array.

After epitaxy, a continuous layer 5 can be obtained of the required thickness and crystalline quality. The critical thickness 39 for this layer 5 is always greater than the thickness that would have been obtained with a host substrate that is not structured. If this critical thickness 39 is exceeded, the defect rate in the layer will be lower than would have been obtained with a layer of same thickness without structuring the host substrate.

By way of example, the host crystalline material i.e. the material of the bumps, or often that of the substrate 2 provided with bumps, can be chosen from among silicon Si, germanium Ge, gallium arsenide GaAs, silicon carbide SiC, indium phosphide InP, sapphire, diamond, zirconium, magnesium oxide MgO, these materials being taken alone or in combination. The material deposited by epitaxy can be chosen from among silicon Si, germanium Ge, gallium nitride GaN, diamond, silicon carbide SiC, indium phosphide InP, gallium arsenide GaAs, indium arsenide InAs, silicon-germanium $Si_xGe_{1-x}$, III-V compounds e.g. of InGaAs type, or II-VI compounds for example of CdTe type, these materials being taken alone or in combination. The material of the epitaxied layer in its continuous part is generally different from the material of the host substrate 2.

It may be of advantage to cause the composition of the material deposited during epitaxy to be varied. For example on a structured substrate in silicon, it is possible to grow $Si_xGe_{1-x}$ with x variant between a first value $\alpha$ such that $0<\alpha<1$ and a second value $\beta$ such that $0\leq\beta<1$ (advantageously $\beta=0$). Variation may or may not be linear. Epitaxial growth can be continued using germanium. For an equivalent critical thickness for the germanium layer, a much smaller thickness is needed for the epitaxied $Si_xGe_{1-x}$ layer with x variable on the support zones 35, than if epitaxy of $Si_xGe_{1-x}$ (with x variable) was conducted on a non-structured substrate.

One advantage of the method of the invention compared with the prior art, is that a lithography step is no longer required nor is a mask required in which it was difficult to etch openings having a density and dimensions such that these openings lead to an epitaxied layer whose strains are well relaxed. With the method of the invention, since it is possible to obtain a greater bump density than the density of openings etched in the mask, with a period that is very accurately controlled, and since it is possible to obtain bumps having a support zone that is smaller than that of the mask openings, it will be easier to obtain better stress relaxation of the epitaxied layer. The formed epitaxied layer 5 may have strains that are as minimized as possible and hence a strain relaxation rate that is as high as possible. The growth of this layer may be made without any plastic relaxation, thereby avoiding the formation of defects which conventionally occur on account of this plastic relaxation. It will nevertheless be possible, if desired, to exceed the critical thickness: in this case a layer having defects will be obtained but in lesser quantity than a layer which would have been obtained without the invention. The material of the epitaxied layer may possibly have a very different lattice parameter e.g. differing by several percents, from the lattice parameter of the substrate of the host substrate 12 provided with the bump array.

Another advantage of the method of the invention is that the formation of the bumps is made collectively with very small dimensions, in highly accurate manner and with great regularity, irrespective of the size of the assembled elements. This method is applied with the same strains both to substrates 100 millimeters in diameter and to larger substrates of 150, 200 or 300 millimeters in diameter for example. These dimensions are standard industrial sizes for silicon substrates. With the prior art method, etching of the mask had recourse to lithography techniques which are more time-consuming and more costly for large substrates than for smaller substrates, and which are not always available for small-size substrates of less than 50 millimeters for example.

With reference to FIGS. 2A to 2K, another example of the method of the invention will now be described which is based on the teaching of patent application FR-A-2 819 099 and patent application FR-A-2 815 121. This method consists of assembling two elements by orienting them in rotation relative to one another in extremely accurate manner, this accuracy being due to the fact that the two elements have been taken from one same crystalline substrate, e.g. semiconductor, which is provided with one or more locating marks so that sampled elements carry these locating marks. This method has the advantage of minimizing, even cancelling out, the tilt angle. As in patent application FR-A-2 815 121, one of the elements is included in a composite substrate formed of a support, a stop layer for support thinning, and at least the crystalline layer forming the element to be assembled. It may for example be a semiconductor on insulator substrate, SOI. A SOI substrate may comprise two layers of semiconductor material located either side of an insulator layer. One of the layers of semiconductor material is less thick than the other. The thicker layer corresponds to the support of the composite substrate, the insulator layer to the stop layer for support thinning, and the less thick layer to the element to be assembled. It is via the less thick layer that the semiconductor on insulator substrate will be assembled to the other element.

In this example, the starting substrate is a base substrate 100 in crystalline semiconductor material, e.g. silicon, having a free face 101 oriented in direction <001>. The diameter of this substrate can be 100 millimeters, but a smaller substrate could be used or a larger substrate of 150, 200 or even 300 millimeters in diameter. The choice of this orientation <001> allows a bump array to be obtained having a symmetry in the order of 4. It is evidently possible to use a base substrate whose surface has another crystalline orientation, e.g. crystalline orientation <111> which would give the bump array a symmetry in the order of 3.

This substrate 100 will be treated so that it is possible to take two parts therefrom having crystalline surfaces which will subsequently be bonded together. It is possible to start by forming an oxide layer 102 by heat oxidizing the free face 101. This oxide layer 102 may have a thickness of around 400 nanometers. This step is illustrated FIG. 2A. The oxide layer 102 will subsequently be used as thinning stop layer.

Figure 2A:
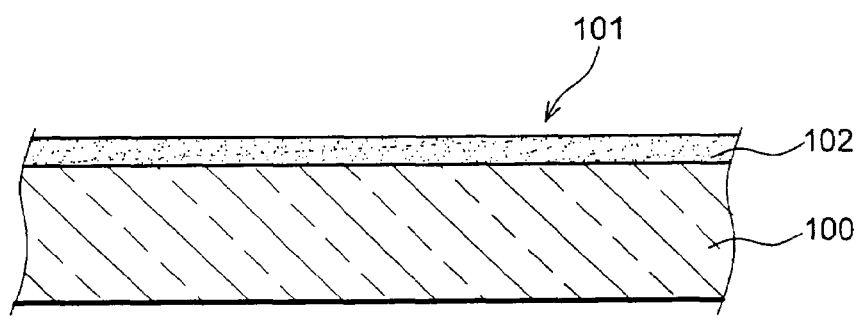
FIGS. 2A to 2K show the steps to produce an epitaxied structure following another example of the method of the invention.
Figure 2B:
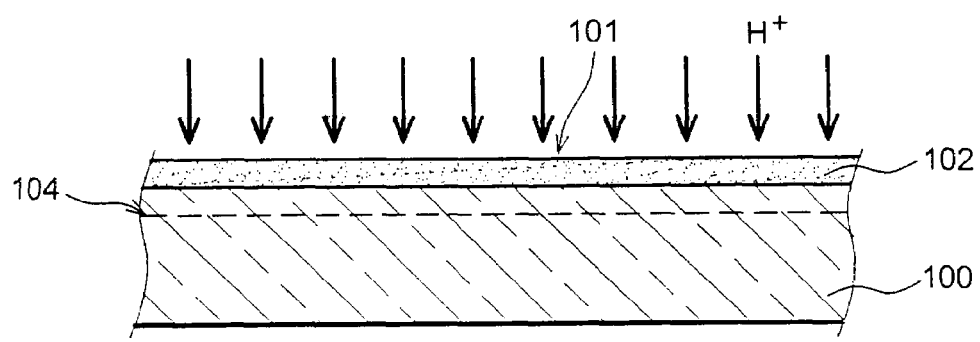

The base substrate 100 will then be weakened using implanted ions e.g. hydrogen ions or of any other gaseous species able to generate a buried weak zone and capable subsequently of inducing a fracture at this weakened zone. This weakened zone 104 will assume the form of a plane located in the silicon of the base substrate 100, underneath the oxide layer 102 at a distance in the order of the implantation depth. Implanting is made from the free surface 101 of the oxide layer 102. Implanting energy, for a silicon substrate, may for example be around 76 keV and the dose of hydrogen ions may be around $6.10^{16}$ atoms/cm$^2$. Under these conditions, for an oxide layer 102 of 400 nanometers, the weakened zone 104 lies at approximately 760 nanometers from the free surface of the oxide layer 102. Reference is made to FIG. 2B.

Figure 2C:
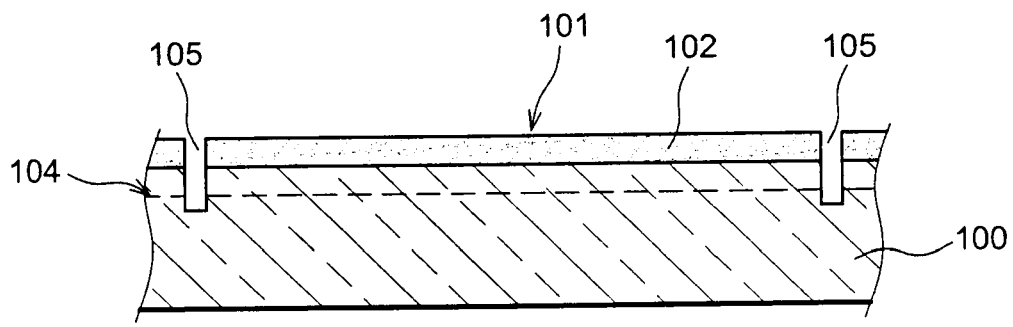

Next, one or more locating marks 105 are made, e.g. by photolithography and chemical, ionic or other etching in the oxide layer 102 and in the underlying semiconductor of the base substrate 100, these locating marks 105 encroaching into the base substrate 100 beyond the weakened zone 104 relative to the oxide layer 102. Other methods to etch these locating marks could be used, for example using a laser. The locating marks 105 could fully pass through the base substrate 100. Reference can be made to FIG. 2C which illustrates these locating marks 105. These locating marks 105 can be configured as explained in patent application FR-A-2 819 099 and assume the form of graduated scales such as protractors. The graduations may for example indicate degrees, tenths of degrees, hundredths of degrees or thousandths of degrees. If there are two locating marks, they may lie diametrically opposite on the base substrate 100.

Figure 2D:
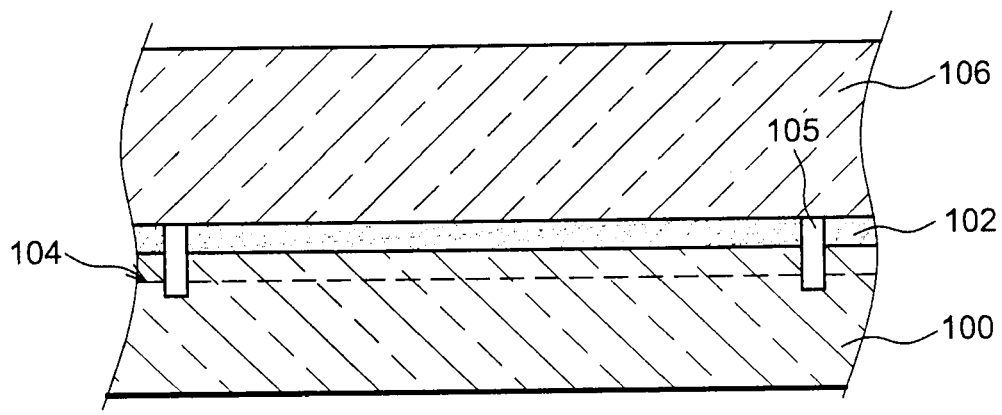
Figure 2E:
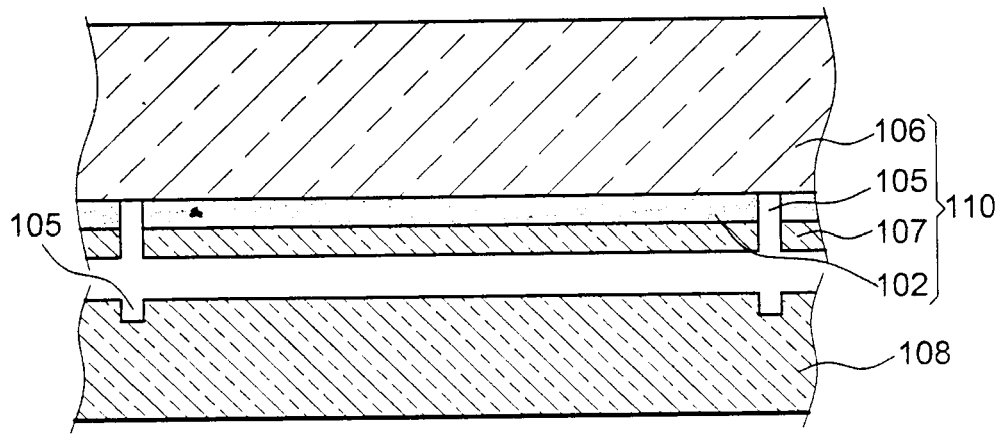

Next, according to FIG. 2D, the structure in FIG. 2C is assembled on an auxiliary substrate 106 e.g. in silicon. This assembly is made via the face carrying the oxide layer 102. The assembly method may use hydrophilic molecular bonding.

A fracture is then made along the plane of the weakened zone 104, for example using heat treatment e.g. at 500° C. for one hour. This heat treatment also has the advantage of reinforcing molecular bonding. We then have two elements 110, 108 as illustrated FIG. 2E. In our example, one of the elements 110 is a substrate of semiconductor on insulator type, and in the case in hand it is silicon on insulator, it is formed of the stack of the auxiliary substrate 106, the oxide layer 102 and a thin crystalline film of silicon 107 taken from the base substrate 100 by means of the fracture. The other element 108 corresponds to what remains of the base substrate 100. The two elements 108, 110 are both provided with locating marks 105 and comprise a crystalline part 107, 108 derived from the base substrate 100.

Figure 2F:
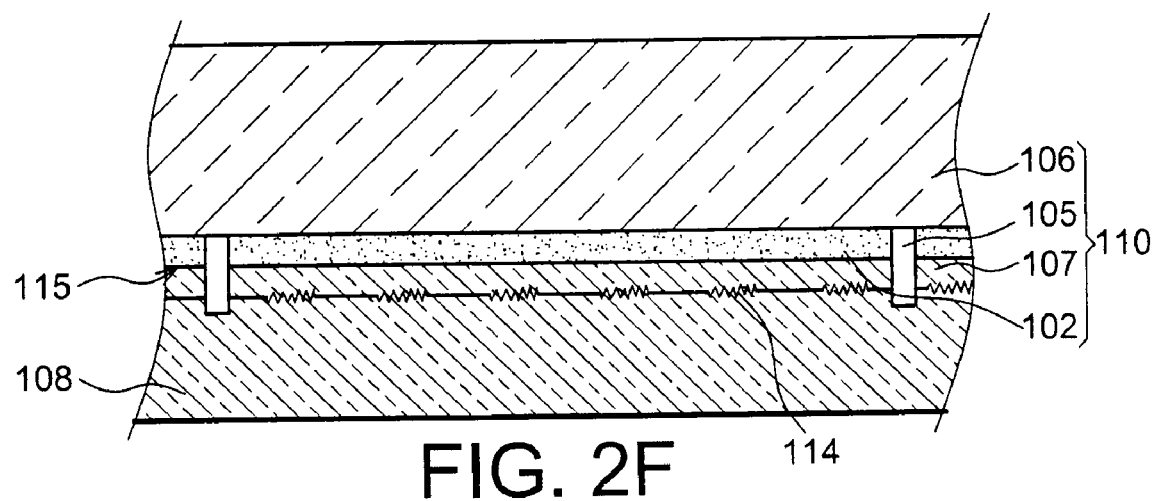
Figure 2G:
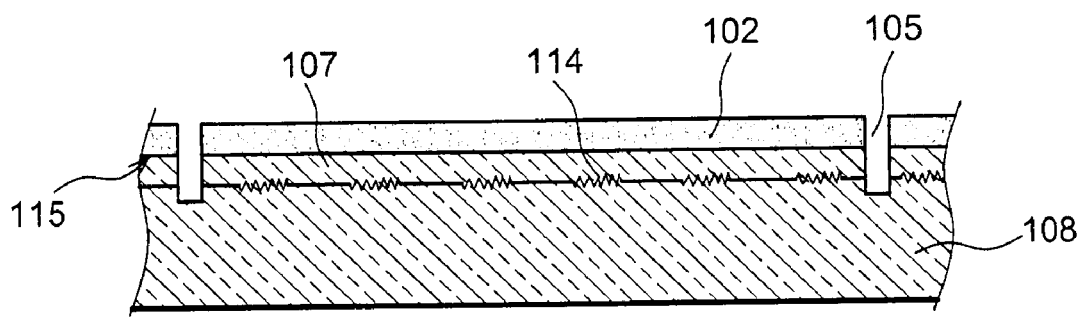

Element 110, which in the example is of SOI substrate type, can be subjected to annealing, oxidizing and polishing treatment on the side of the thin film 107 which comprises the locating marks 105, evidently without causing the locating marks 105 to disappear. Provision is made so that, at the end of the treatment, the thin film of silicon 107 maintains a thickness in the order of 100 nanometers for example. The other element 108 which in the example is solid, can be subjected to polishing on its face carrying the locating marks 105 so as to obtain a polished surface compatible with subsequent bonding, evidently without causing the locating marks 105 to disappear. It is these two crystalline parts 108, 107 which are to be bonded to each other, at a bonding interface, by molecular bonding e.g. hydrophobic bonding by introducing a determined twist angle in highly accurate manner using the locating marks 105 on the two crystalline parts 107, 108. The value of the twist angle can be 0.44° for example or 1.1°. These values will create an array of crystalline defects and/or strain fields of symmetry 4 and having a period of 50 and 20 nanometers respectively. Reference can be made to FIG. 2F which illustrates the bonding step. At this stage generally heat treatment is conducted to reinforce bonding, e.g. at 700° C. for one hour.

Figure 4A:
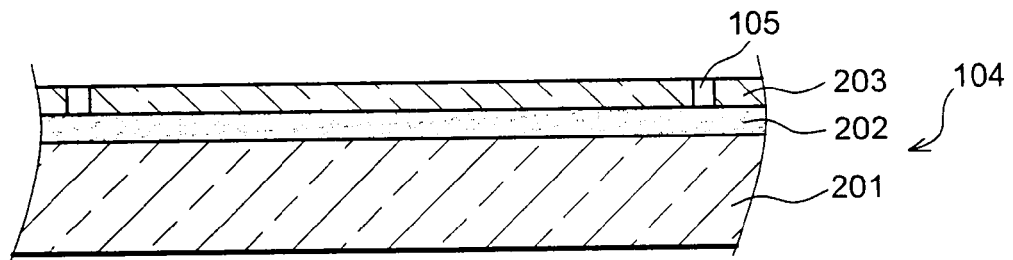
FIGS. 4A to 4D illustrate the use of a composite substrate in the example shown FIG. 2, instead of a solid substrate.
Figure 4B:
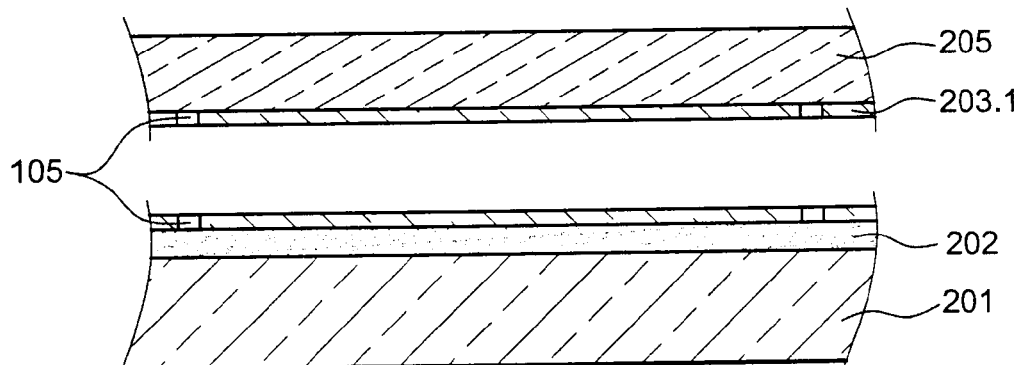
Figure 4C:
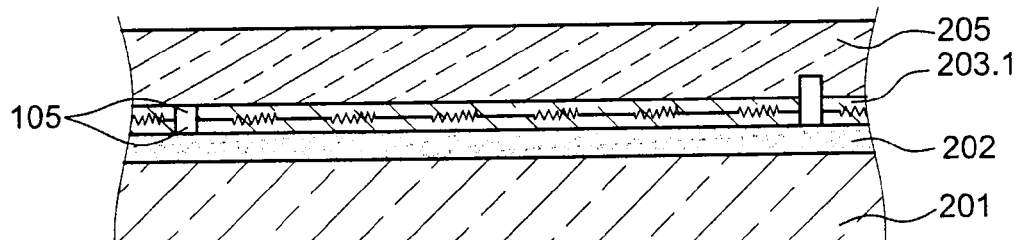

As a variant, it would be possible to start not with a solid base substrate but with a composite base substrate 200 as defined previously with a support 201, a support thinning stop layer 202 and at least one crystalline layer 203 (FIG. 4A). A thin crystalline film 203.1 would be taken from the crystalline layer 203 and transferred onto another support 205 (FIG. 4B). The structure obtained could then be assembled with the remainder of the composite substrate 200 from which the thin film was taken, by introducing a determined twist angle in most precise manner by means of the locating marks 105 which were initially carried by the composite substrate 200 (FIG. 4C).

The periodic array of bumps on a nanometric scale will now be formed which will act as base for the columns. The description is continued from the structure obtained in FIG. 2F, but the description could also apply to the structure obtained in FIG. 4C.

Figure 4D:
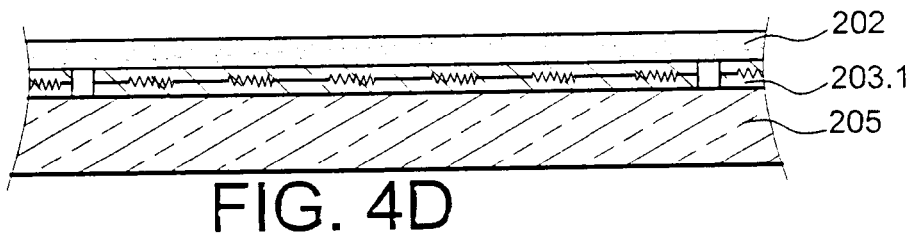

Instead of thinning one of the elements 11 until the array of crystalline defects and/or strain fields is exposed as described for FIG. 1, one of the elements 110, 108 will be thinned without exposing the array of crystalline defects and/or strain fields. In the described example, element 110 will be thinned which is formed by the semiconductor on insulator substrate. It is evidently possible, as a variant, in particular if the starting substrate is composite as described for FIG. 4, to thin the substrate 200 starting from the support 201 as far as the stop layer 202 as illustrated FIG. 4D.

Thinning of element 110 consists of preserving in full or in part the thin film 107 taken from the base substrate 100 in FIG. 2D. To obtain thinning, first the auxiliary substrate 106 is removed which formed the thickest silicon part of the SOI substrate 110. This removal can be made using a mechanical method for example known to those skilled in the art, then by a chemical method using TMAH for example (Trimethyl ammonium hydroxide). Chemical attack stops at the oxide layer 102. This step is illustrated FIG. 2G.

Next, the oxide layer 102 is removed by attacking with an aqueous hydrofluoric acid solution for example, HF. The concentration of hydrofluoric acid may be 10%. The thin film 107 can then be thinned, reducing its thickness to less than 20 nanometers for example.

Figure 2H:
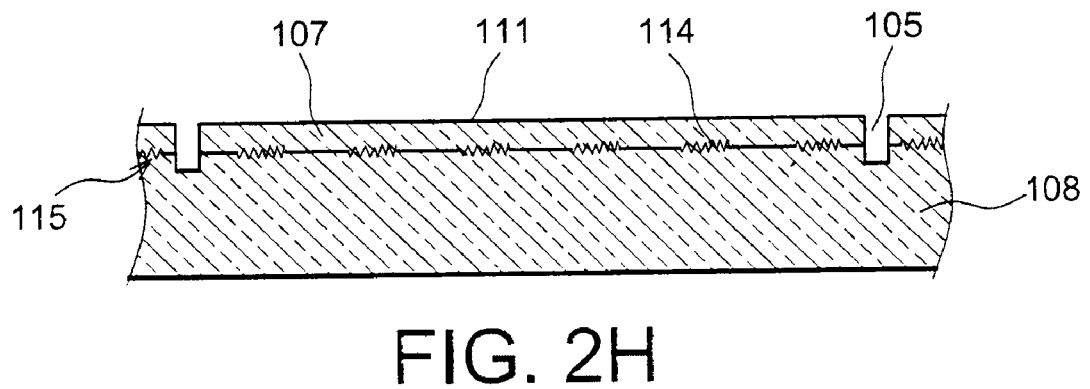
Figure 2I:
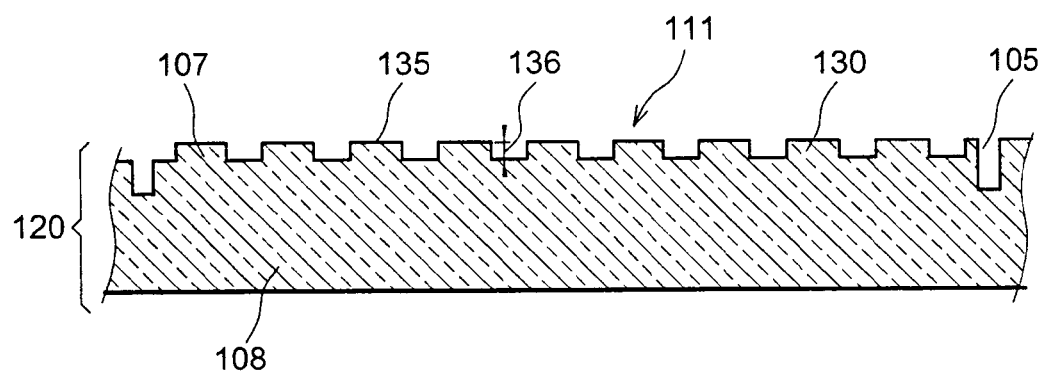

This thinning may consist of chemical attack and/or thermal oxidation followed by chemical attack, chemical attack possibly using an aqueous hydrofluoric acid solution. The sequence of thermal oxidation followed by chemical attack corresponds to sacrificial treatment. At this point, the free surface 111 of the thinned film 107 does not expose the presence of the array of crystalline defects and/or strain fields 114. The structure shown FIG. 2H is obtained. The following step, illustrated FIG. 2I, consists of treating the thinned film 107 so that its free face 111 exposes the presence of the array of crystalline defects and/or strain fields 114 around the bonding interface 115. This treatment may be a chemical attack which preferably attacks the strain areas. After this treatment, a surface is obtained having an array of bumps 130 on a nanometric scale. This chemical attack may be made using aqueous chemical solutions containing hydrofluoric acid and chromium trioxide $CrO_3/HF$; hydrofluoric acid and nitric acid $HNO_3/HF$; bichromate ions and hydrofluoric acid $Cr_2O_7/HF$. To these solutions acetic acid can be added and/or an alcohol such as ethanol or propanol and/or ammonia. To adjust the height 136 of the bumps in particular and the size of their support zones 135, the exposing step can be completed by other surface treatment steps such as other chemical attacks, reactive ion etching (RIE), oxidations and deoxidations, electrochemical attack, photochemical attack, material deposits etc. It is possible for example to deposit germanium, typically the equivalent of a film of 1 nanometer. Deposit is made essentially on the support areas 135 which are in silicon in our example. It will then be possible to increase the height of the bumps 130 by selective etching of the silicon with respect to the germanium. The thin film of germanium located on the support zones 135 may optionally be removed before the columnar epitaxy step.

It is possible for example to obtain bumps 130 approximately 10 nanometers in height, two neighbouring bumps 130 being spaced apart by around 4 nanometers and the period of the array being around 20 nanometers. It is specified that the period corresponds to the interval formed by a support area and its following or preceding space.

As a variant or in combination, the exposure step may consist of a heat schedule. This heat schedule may be provided in the form of annealing optionally in the presence of a particular gas, or vacuum annealing. The purpose of this heat schedule is to cause a change in the topology of the free surface 111 of the thin film 107 by causing bumps 130 and recesses to occur which depend on the topology of the array of crystalline defects and/or strain fields 114 lying in the vicinity of the interface 115, i.e. which is buried relative to the free surface 111 of the thin film 107.

Other methods can be used to expose the array of crystalline defects and/or strain fields 114, such as adding chemical species to the thin film 107 or to the other element 108 e.g. by diffusion or ionic implantation. The adding of chemical species can be combined with a heat schedule, this adding possibly taking place before and/or after and/or during the application of the heat schedule. The added chemical species can be gold, copper, titanium, aluminium or a dopant e.g. boron for silicon. The added chemical species localize at the defects and/or maximum strain areas. It is then possible, in order to expose the bump array, to use a selective etching step for example.

Exposure can also be obtained by chemical and/or electrochemical and/or ionic and/or photochemical and/or mechanical attack of the thinned element (thin film 107 or element 108). In the same manner, this attack can be combined with the heat schedule, it can take place before and/or after and/or during the application of the heat schedule.

The attack step(s) can be carried out in various atmospheres, whether oxidizing or reducing.

It is also possible at this stage to modify the bump array to make it more compatible, in particular in terms of lattice parameter, with the epitaxy to follow. It is possible for example to implant the support areas 135 with boron, arsenic, silicon, germanium for example for silicon bumps, so as to widen the support zones i.e. to increase their surface. This implantation must nonetheless preserve the crystalline quality of the support zones to ensure satisfactory quality for subsequent epitaxy. This implantation can be associated with a diffusion step of the implanted species.

It is then possible to proceed with depositing the material to be epitaxied e.g. germanium. In this case, epitaxy may be gaseous phase epitaxy for example or molecular beam epitaxy (MBE). This depositing step, conducted at a temperature in the order of 600° C., is illustrated in the two FIGS. 2J and 2K, one corresponding to column deposit and the other to deposit of the continuous layer once the columns have joined together.

Figure 2J:
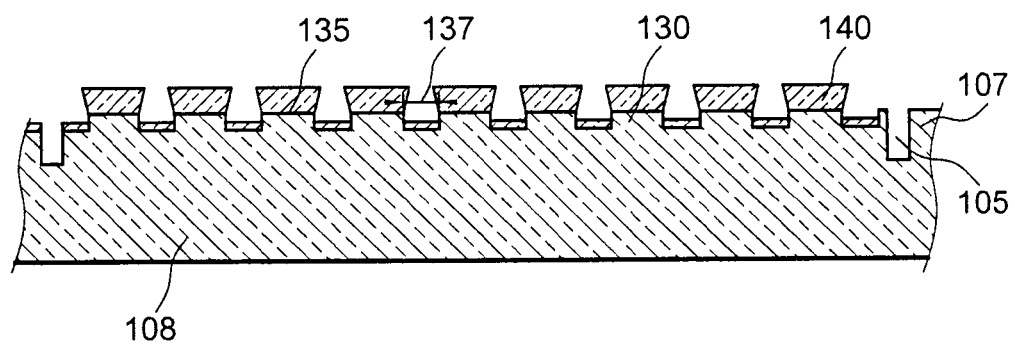
Figure 2K:
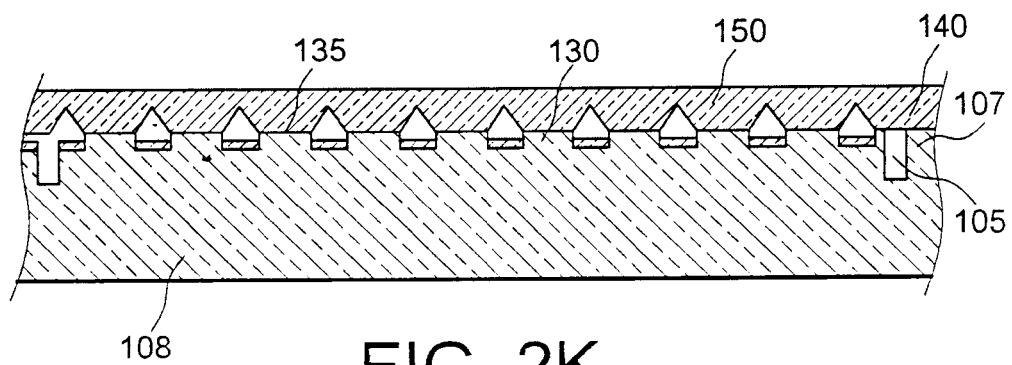

At the start of deposit, columns 140 are formed on the bump support zones 135 as illustrated FIG. 2J. Depositing is continued and the columns 140 flare outwardly, increasing their diameter, and end up by joining together. The continuous layer 150 then takes shape as in FIG. 2K. The material which is deposited on the bumps 130 will relax its strain by modifying the diameter of the columns 140. Measurement of the lattice parameters indicates the strain relaxation rate of the deposited material. With the adjustment of the twist angle and control over the formation of the bump array 130, the geometric parameters of the columns 140 can be controlled with great accuracy, i.e. their base section and their spacing, based on the size of the support zone 135 of the bumps 130, their height 136 and their spacing 137. With control over these dimensional parameters, it is possible to obtain a continuous layer 150 whose strain relaxation rate is as high as possible for example. The formation of the columns 140 and hence of the continuous layer 150 is able to be made in reproducible manner over an entire surface of a base substrate without having recourse to costly, time-consuming nanolithography techniques.

In one application of the invention, the epitaxied continuous layer 150 obtained can be transferred onto another substrate with which it may or may not have a crystallographic relationship. The other substrate which is to receive the epitaxied continuous layer can be in a plastic material for example, in glass or another crystalline material such as a semiconductor material e.g. silicon, an oxide of a material such as silica or even a carbide of a semiconductor material such as silicon carbide. This transfer can be made by implanting gaseous species able to provide a buried weakened zone, followed by fracturing at this zone e.g. by heat and/or mechanical treatment as described in patent application FR-A-2 681 472.

It is also possible for example to bond, by molecular bonding, the free surface of the epitaxied layer onto a host substrate and to remove the initial substrate on which growth took place, using grinding, polishing or suitable chemical attack. Another variant could consist of using mechanical transfer to transfer the epitaxied layer, taking advantage of the weakness induced by the voids existing between the columns underneath the continuous layer. These steps are not shown to avoid having to multiply the number of figures.

According to one variant of the invention, in order to reduce costs, it is possible to produce a single substrate 2 or 120 provided with the bump array on a nanometric scale as just described for FIGS. 1 and 2, and to duplicate this substrate one or more times using nanoimprint lithography (NIL).

Figure 3A:
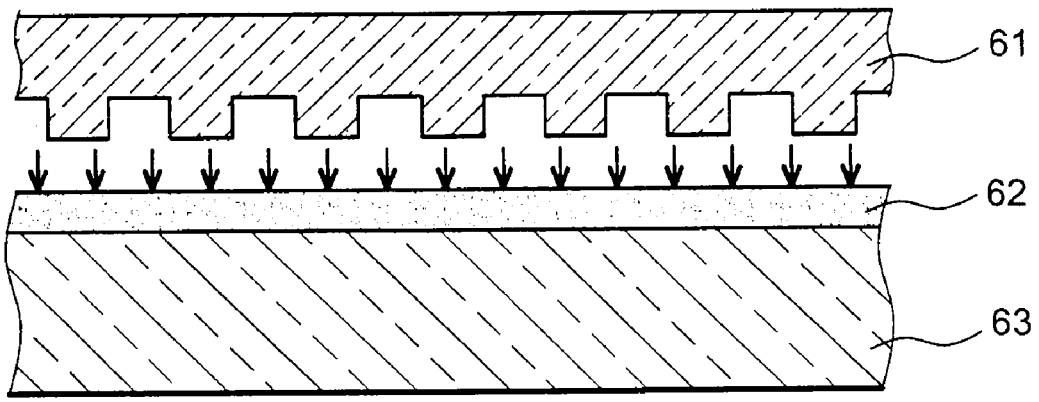
FIGS. 3A to 3F show the steps to produce an epitaxied structure following a further example of the method of the invention.
Figure 3B:
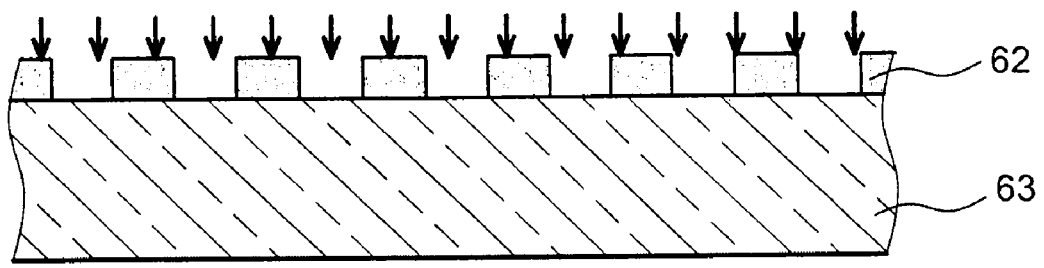
Figure 3C:
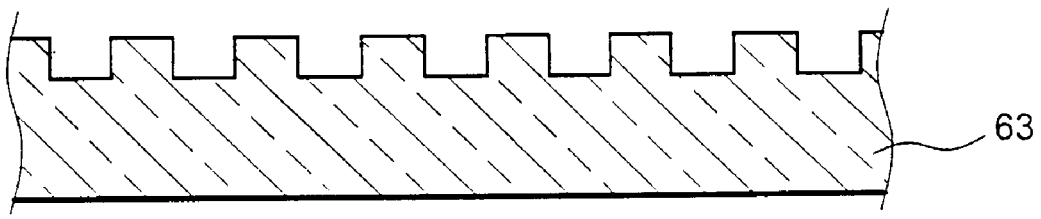

This technique consists of producing a mould of the bump array of substrate 61 (called mother substrate) via a layer 62 e.g. of resin carried by a substrate 63 as illustrated FIG. 3A. This transfer can be made for example by hot embossing or ultraviolet exposure (FIG. 3B). The substrate 63 is then etched, which is in silicon for example, using the openwork resin layer 62 as mask. Etching can be reactive ion etching (RIE). A pattern is obtained in the substrate 63, which mates with the pattern of the bump array of the mother substrate 61 and which is subsequently used as mould. Reference is made to FIG. 3C.

Figure 3D:
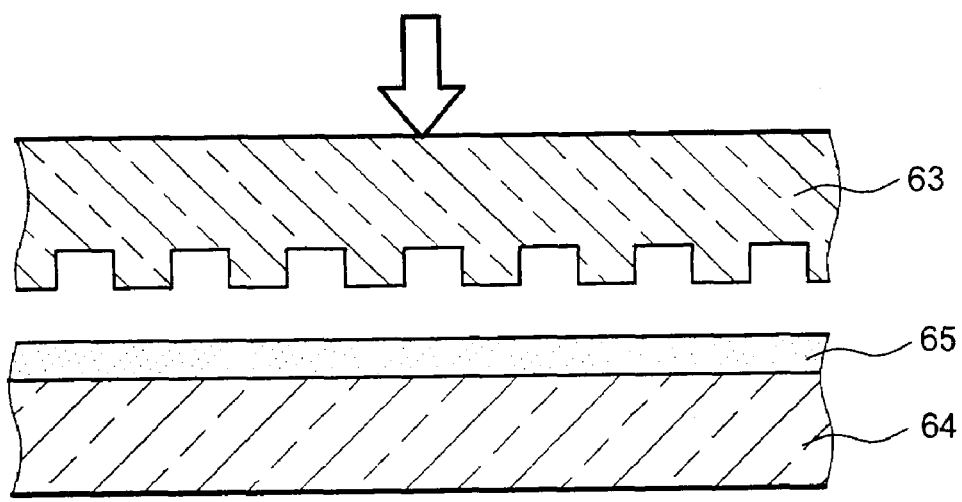
Figure 3E:
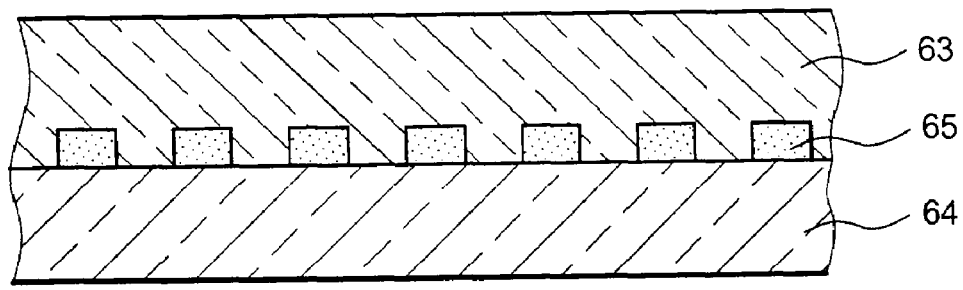
Figure 3F:
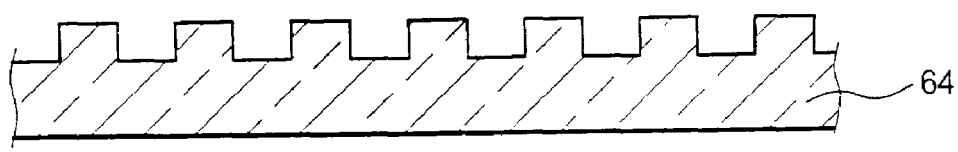

Next, a crystalline substrate 64 is coated with a layer of polymer resin 65 for example. The mould imprint 63 is made in the polymer layer 65 e.g. by hot embossing or ultraviolet exposure as illustrated FIGS. 3D and 3E. Then the crystalline substrate 64 is etched through the imprint left in the layer of polymer resin 65 as illustrated FIG. 3F. A replica is then obtained of the mother substrate 61 provided with a bump array substantially identical to that of the mother substrate. This nanoimprint lithography technique is described for example in the article <<Replication of sub-40 nm gap nanoelectrodes over an 8-in. Substrate by nanoimprint lithography >> Tallal J. et al, Microelectronic engineering, 2005, vol. 78-79 pages 676 à 681.

Although several embodiments of the present invention have been shown and described in detail, it will be appreciated that different changes and modifications can be made thereto without departing from the scope of the invention.

The invention claimed is:

1. A method for producing an epitaxied structure consisting of depositing a material by columnar epitaxial growth on a crystalline face of a substrate (2), of continuing deposit until the columns (4) join together and lead to a continuous layer (5), characterized in that it consists of providing the face of the substrate with a periodic array of bumps (3) on a nanometric scale each bump (3) having a support zone (35) for a column (4), and being obtained directly or indirectly from an array crystalline defects and/or strain fields created within a crystalline region (16) located in the vicinity of a bonding interface (15) between two elements (11, 12) comprising crystalline material and having crystalline lattices with a twist and/or tilt angle and/or having interfacial lattice mismatch, able to condition the period (38) of the array of bumps (3), the period (38) of the array, the height (36) of the bumps and a size of their support zone (35) being adjusted so that the continuous layer (5) has a critical thickness (39) greater than the thickness obtained with an epitaxy conducted without the presence of bumps.

2. The method according to claim 1, wherein the material deposited by epitaxy has a natural lattice parameter, characterized in that the period (38) of the array, the height (36) of the bumps and the size of their support zone (35) are adjusted so that the material deposited by epitaxy has recovered its natural lattice parameter at the time the columns join together.

3. The method according to claim 1, characterized in that it consists of producing the substrate (2) whose face is provided with the bump array (3) from the two bonded elements (11, 12), by thinning one of the elements (11) until a surface relief is exposed corresponding to the array of crystalline defects and/or strain fields, this relief then forming the bump array, this bump array (3) being supported by the other element (12).

4. The method according to claim 3, characterized in that thinning comprises at least one step chosen from among mechanical abrasion, chemical abrasion, grinding, sacrificial treatment.

5. The method according to claim 1, characterized in that it also comprises a step to treat the bump array so as to adjust the height (36) and/or size of the support zone (35) of the bumps (3) and/or to modify the lattice parameter of the constituent material of the bumps (3).

6. The method according to claim 5, characterized in that the treatment step of the array of bumps (3) comprises an implanting step.

7. The method according to claim 3, characterized in that the thinning step and/or treatment step of the array of bumps (3) comprises at least one chemical attack and/or electrochemical attack and/or mechanical attack and/or ionic attack and/or photochemical attack and/or depositing step, in various oxidizing or reducing atmospheres.

8. The method according to claim 3, characterized in that the thinning step and/or treatment step of the array of bumps (3) comprises the application of a heat schedule.

9. The method according to claim 1, characterized in that, to form the elements, at least two parts (108, 107) are taken from one same crystalline structure (100), these two parts contributing towards the formation of the bonding interface (115).

10. The method according to claim 9, characterized in that, during bonding, the crystalline lattices of the two parts are offset from a predetermined twist and/or tilt angle ($\theta$).

11. The method according to claim 10, characterized in that the crystalline structure comprises locating marks (105) which are transferred to the two parts (108, 107) at the time they are taken, these locating marks being used to adjust the twist and/or tilt angle ($\theta$).

12. The method according to claim 1, characterized in that at least one of the elements (110) is a composite substrate formed of a stack of a support (106), a stop layer (102) for thinning of the support and of at least one crystalline layer (107).

13. The method according to claim 12, characterized in that the thinning step concerns the composite substrate (110).

14. The method according to claim 12, characterized in that the composite substrate is a SOI substrate.

15. The method according to claim 12, characterized in that the part that is taken (107) comprises at least the crystalline layer.

16. The method according to claim 1, characterized in that bonding is molecular bonding.

17. The method according to claim 1, characterized in that the composition of the deposited material varies during epitaxial deposit.

18. The method according to claim 1, characterized in that the substrate (64) whose face is provided with the bump array is made by duplicating a mother substrate (61) of which one face comprises a bump array on a nanometric scale, the mother substrate (61) being obtained from the two bonded elements and by at least one thinning step of one of the elements, leading directly or indirectly to exposure of the array of crystalline defects and/or strain fields forming the bump array.

19. The method according to claim 18, characterized in that duplication is made by nanoimprinting from a mould (63) which matches the mother substrate (61).

20. The method according to claim 19, characterized in that the mould (63) is obtained by nanoimprinting from the mother substrate (61).

21. An epitaxied structure comprising columns (4) of epitaxied material flaring outwardly so that they join together and form a continuous layer (5) characterized in that each column (4) bears upon a support zone (35) of a bump (3) of a periodic bump array on a nanometric scale provided on one face of a substrate (2), these bumps being derived directly or indirectly from an array of crystalline defects and/or strain fields, the bumps (3) of the array having a period (38), a height (36) and a size of support zone (35) that are adjusted so that the continuous layer (5) has a critical thickness (39) that is greater than that obtained with epitaxy conducted without the presence of bumps.

* * * * *